United States Patent
Ikeguchi et al.

(10) Patent No.: US 8,030,752 B2
(45) Date of Patent: Oct. 4, 2011

(54) METHOD OF MANUFACTURING SEMICONDUCTOR PACKAGE AND SEMICONDUCTOR PLASTIC PACKAGE USING THE SAME

(75) Inventors: Nobuyuki Ikeguchi, Suwon-si (KR); Keungjin Sohn, Seoul (KR); JoonSik Shin, Suwon-si (KR); Jung-Hwan Park, Seongnam-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 358 days.

(21) Appl. No.: 12/213,796

(22) Filed: Jun. 24, 2008

(65) Prior Publication Data

US 2009/0152742 A1    Jun. 18, 2009

(30) Foreign Application Priority Data

Dec. 18, 2007  (KR) .......................... 10-2007-0133242
Dec. 20, 2007  (KR) .......................... 10-2007-0134335

(51) Int. Cl.
*H01L 23/04* (2006.01)
*H01L 23/12* (2006.01)

(52) U.S. Cl. ........ 257/698; 257/700; 257/778; 257/686; 257/E23.001

(58) Field of Classification Search .................. 257/698, 257/778, 257, 678, 686, 693, 700–707, 737, 257/738, 777, E23.001–E23.194, E25.006, 257/E25.021, E25.027, E23.085; 438/106, 438/107, 108, 109, 455–458, 612–615; 361/718–720, 722, 728, 730, 736

See application file for complete search history.

(56) References Cited

U.S. PATENT DOCUMENTS

| 6,313,522 B1 * | 11/2001 | Akram et al. ................. 257/686 |
| 6,365,963 B1 * | 4/2002 | Shimada ....................... 257/686 |
| 7,365,416 B2 * | 4/2008 | Kawabata et al. ............ 257/686 |

FOREIGN PATENT DOCUMENTS

| JP | 7-240496 | 9/1995 |
| JP | 8-250650 | 9/1996 |
| JP | 2005-302922 | 10/2005 |
| JP | 2006-165236 | 6/2006 |
| KR | 10-0754070 | 8/2007 |

OTHER PUBLICATIONS

Korean Office Action issued Apr. 29, 2010 in corresponding Korean Patent Application 10-2007-0133242.
Japanese Office Action for corresponding Japanese Patent Application No. 2008-198305 dated Nov. 24, 2010 (3 pgs).

* cited by examiner

*Primary Examiner* — Jasmine Clark

(57) ABSTRACT

A method of manufacturing a semiconductor package may include: forming a first board; forming second boards, in each of which at least one cavity is formed; attaching the second boards to both sides of the first board, such that the second boards are electrically connected with the first board; and connecting at least one component with the first board by a flip chip method by embedding the component in the cavity. The method can prevent damage to the semiconductor chips and lower manufacturing costs, while the connection material may also mitigate stresses, to prevent cracking in the boards and semiconductor chips, while preventing defects such as bending and warpage. Defects caused by temperature changes may also be avoided. Furthermore, it is not necessary to use an underfill in the portions where the semiconductor chips are connected with the printed circuit board, which allows for easier reworking and lower costs.

19 Claims, 14 Drawing Sheets

METHOD OF MANUFACTURING SEMICONDUCTOR PACKAGE AND SEMICONDUCTOR PLASTIC PACKAGE USING THE SAME

CROSS-REFERENCE TO RELATED APPLICATIONS

This application claims the benefit of Korean Patent Application No. 10-2007-0133242 and No. 10-2007-0134335 filed with the Korean Intellectual Property Office on Dec. 18, 2007, and Dec. 20, 2007, respectively, the disclosures of which are incorporated herein by reference in their entirety.

BACKGROUND

1. Technical Field

The present invention relates to a method of manufacturing a semiconductor package and to a semiconductor plastic package manufactured using this method.

2. Description of the Related Art

Current electronic devices are trending towards smaller, thinner, and lighter products. In step with these trends, the preferred methods for mounting semiconductor chips are changing from wire bonding methods to flip chip methods, which allow greater numbers of terminals. Furthermore, there is a demand also for higher reliability and higher densities in the multilayer printed circuit board, to which semiconductor chips may be mounted.

In the conventional multilayer printed circuit board, if fiberglass woven fabric is used for the base material, E-glass is generally used for the glass component.

A thermosetting resin composition may be impregnated into the fiberglass woven fabric, dried, and put in a B-stage condition, which can then be processed into a copper clad laminate. This copper clad laminate can be used to fabricate a printed circuit board core, for use in the inner layers, after which B-stage insulation sheets may be arranged and stacked as build-up layers, to manufacture a multilayer printed circuit board.

In the multilayer printed circuit board thus manufactured, a build-up resin composition may be used in many of the layers, which has a high rate of thermal expansion (generally about 18 to 100 ppm/° C. in the longitudinal and lateral directions), and a copper (Cu) layer having a rate of thermal expansion of about 17 ppm/° C. may be included in each layer. On the outermost layers, solder resist layers may be formed which also have a high rate of thermal expansion (generally about 50 to 150 ppm/° C.). Consequently, the overall coefficient of thermal expansion in the longitudinal and lateral directions for the multilayer printed circuit board may be about 10 to 30 ppm/° C.

If an aromatic polyaramid fabric is used as a reinforcing material, the rate of thermal expansion in the longitudinal and lateral directions of a double-sided printed circuit board used for the inner core can become 10 ppm/° C. or lower. Even so, if additional build-up resin compositions and copper layers are included with this board to manufacture a printed circuit board having a large number of layers, the rate of thermal expansion may be increased to a value over 10 ppm/° C.

However, due to the difference in thermal expansion between the semiconductor chip and the multilayer printed circuit board, the many-layered printed circuit board manufactured using an aromatic polyaramid fabric can have lower strength compared to a printed circuit board manufactured using fiberglass non-woven fabric over the entire printed circuit board, so that bending and warpage are more likely to occur. Also, since the reinforcing material and resin are organic substances, the rate of thermal expansion may be greater in the thickness direction in the multilayer printed circuit board, which can lead to problems in reliability.

Even in cases where E-glass fiber woven fabric and aromatic polyaramid fabric are used together, the effect of the resin for the build-up layers as well as of the copper layers, which may have a rate of thermal expansion of about 17 ppm/° C., may make it difficult to manufacture a printed circuit board having a rate of thermal expansion of 10 ppm/° C. in the longitudinal and lateral directions, let alone 9 ppm/° C. or lower.

When mounting a semiconductor chip to this type of multilayer printed circuit board, an underfill resin may be used to provide a structure that absorbs the stresses caused by expansion or contraction when the board is heated or cooled. However, in cases where a semiconductor chip is mounted and connected that has a rate of thermal expansion of 2 to 3 ppm/° C., the difference in thermal expansion can cause bending or warpage. When reliability tests are performed, including temperature cycle tests, etc., for a semiconductor chip mounted and connected without using an underfill resin, especially a semiconductor chip having a rate of thermal expansion of about 3 ppm/° C. connected using lead-free solder, etc., defects may occur, such as cracking in the lead-free solder and semiconductor chip, and detaching between the semiconductor chip and the solder, etc.

Consider the case of a multilayer printed circuit board that uses carbon fiber woven fabric and a metal plate made of copper-Invar, etc., in the center as a core, and includes insulation layers coated over the core. For this multilayer printed circuit board also, the effects of the resin for the build-up layers as well as of the copper layers, which may have a rate of thermal expansion of about 17 ppm/° C., may result in a rate of thermal expansion of 10 ppm/° C. or higher. Moreover, this type of multilayer printed circuit board may entail high material costs, difficult processing procedures, and other problems in terms of reliability and economy. Also, using an underfill resin may not be cost-effective, since it may prevent rework in the package in the event of a malfunction in the semiconductor chip or multilayer printed circuit board, and thereby render the entire semiconductor plastic package defective.

SUMMARY

An aspect of the invention can lower manufacturing costs, prevent cracking in and detaching between the board and semiconductor chip, and prevent defects caused by bending and warpage. Another aspect of the invention can provide a semiconductor plastic package in which damage or detaching of the semiconductor chip or lead-free solder, etc., are not incurred by the stresses applied in a temperature cycle test, etc. Also, another aspect of the invention can provide a method of manufacturing a semiconductor package and a semiconductor plastic package manufactured using this method, which allow reworking for the relevant portions when a defect occurs.

One aspect of the invention provides a method of manufacturing a semiconductor package. The method may include: forming a first board; forming second boards, in each of which at least one cavity is formed; attaching the second boards to both sides of the first board, such that the second boards are electrically connected with the first board; and connecting at least one component with the first board by a flip chip method by embedding the component in the cavity.

The cavity can be formed in such a way that the cavity disconnects the second board.

The first board may have a lower rate of thermal expansion than do the second boards.

In the operation of forming the first board, the first board can be formed with its rate of thermal expansion maintained within a range of −15 to 9 ppm/° C.

In the operation of forming the second boards, the second boards can be formed such that their rates of thermal expansion are maintained within a range of 10 to 25 ppm/° C.

The forming of the first board may include: forming a core board; selectively forming at least one through-hole by perforating the core board; filling a resin composition in the through-hole; attaching a copper foil, to which an insulation layer may be attached, onto either side of the core board; selectively forming conductive through-holes by perforating the resin composition; forming at least one circuit on the core board; and plating the core board.

The core board can include a material selected from a group consisting of thermosetting resins, thermoplastic resins, UV-curable resins, and radical-curable resins.

The core board can include a material selected from a group consisting of inorganic fibers, organic fibers, and metals.

The inorganic fibers may include any one of glass fibers and ceramic fibers.

The organic fibers may include any one selected from a group consisting of poly oxibenzazole fibers, aromatic polyaramid fibers, liquid crystal polyester fibers, and carbon fibers.

The organic fibers can include any one of an aromatic polyaramid non-woven fabric reinforcement and an aromatic polyaramid woven fabric reinforcement.

The metals may include any one of Invar and copper-Invar.

In certain implementations, the attaching can include interposing a board connection material between the first board and the second boards.

The operation of connecting the components can include interposing a component connection material between the components and the first board.

The board connection material and the component connection material may each be formed as bumps or as electrically conductive adhesive. An electrically conductive material can be used for the electrically conductive adhesive that has an electrical resistivity value which allows a satisfactory transmission of electrical signals. Examples of such material include silver paste and copper paste.

The thickness of the component can be smaller than or equal to that of the second board.

Another aspect of the invention provides a semiconductor plastic package, which may include: a first board; a second board attached to either side of the first board, which can be electrically connected with the first board, and in which at least one cavity may be formed; and a component embedded in the cavity and connected with the first board by a flip chip method.

The cavity can be such that disconnects the second board.

The first board may have a lower rate of thermal expansion than the second boards, where the rate of thermal expansion for the first board may lie within a range of −15 to 9 ppm/° C., while the rate of thermal expansion for the second boards may lie within a range of 10 to 25 ppm/° C.

The first board can include: a core board, in which at least one through-hole may be selectively perforated and filled with a resin composition; a copper foil, which may be attached to either side of the core board, and to which an insulation layer may be attached; a conduction through-hole selectively perforated in the resin composition; and a circuit formed on a surface of the core board.

The resin of the core board can be made from thermosetting resins, thermoplastic resins, UV-curable resins, and radical-curable resins, while the core board can be made from a material of inorganic fibers, organic fibers, or metals.

The inorganic fibers may include any one of glass fibers and ceramic fibers; the organic fibers may include any one selected from a group consisting of poly oxibenzazole fibers, aromatic polyaramid fibers, liquid crystal polyester fibers, and carbon fibers; and the metals may include any one of Invar and copper-Invar.

Also, the organic fibers can be formed as one of an aromatic polyaramid non-woven fabric reinforcement and an aromatic polyaramid woven fabric reinforcement.

The semiconductor plastic package may further include a board connection material interposed between the first board and the second boards for electrically connecting the first board with the second boards, and may also include a component connection material interposed between the components and the first board for electrically connecting the components with the first board.

The board connection material and the component connection material can be formed as bumps and/or as electrically conductive adhesive. An electrically conductive material can be used for the electrically conductive adhesive that has an electrical resistivity value which allows a satisfactory transmission of electrical signals. Examples of such material include silver paste and copper paste.

The thickness of the component can be smaller than or equal to that of the second board.

Additional aspects and advantages of the present invention will be set forth in part in the description which follows, and in part will be obvious from the description, or may be learned by practice of the invention.

DETAILED DESCRIPTION

Figure 1:
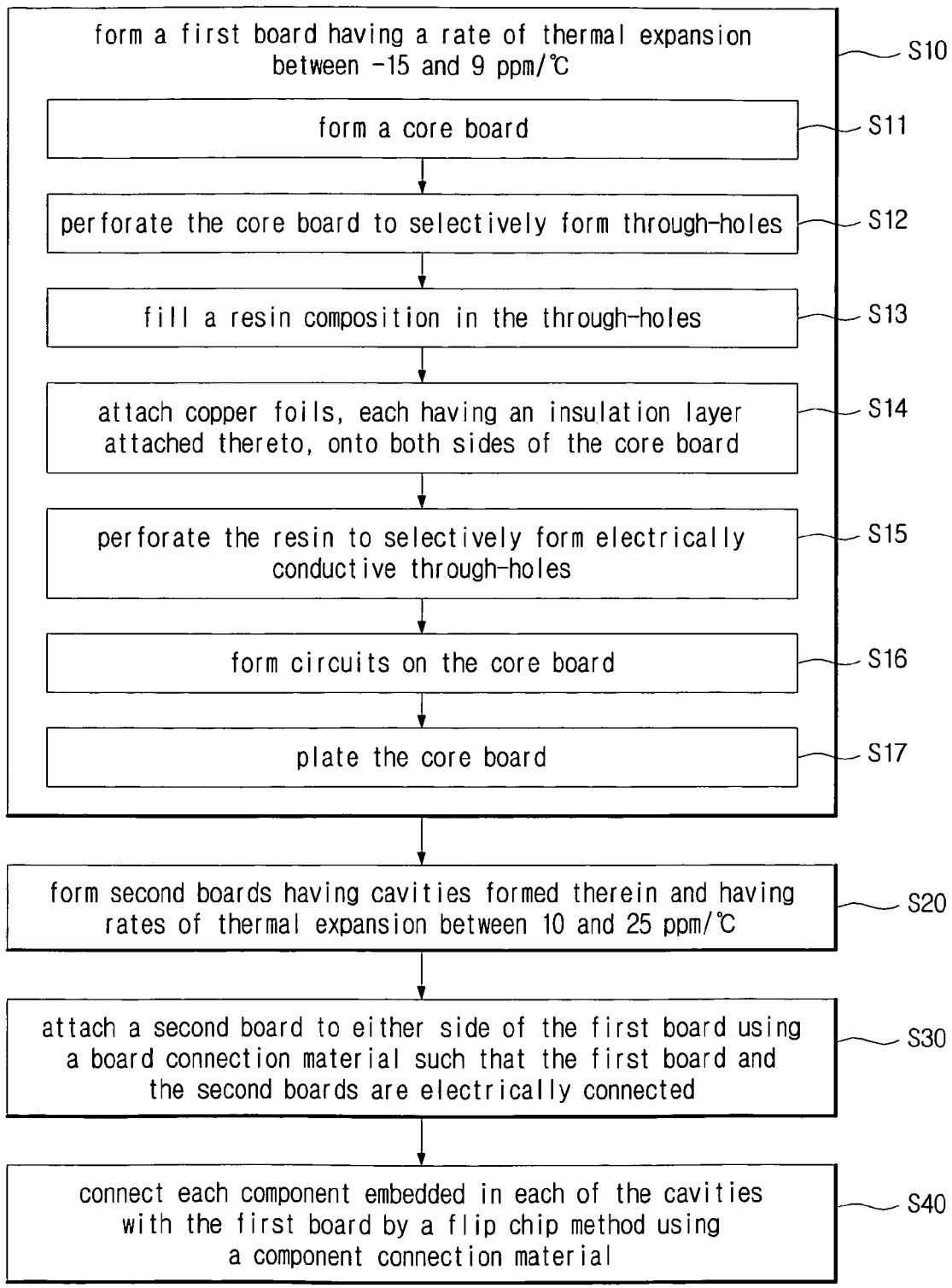
FIG. 1 is a flowchart illustrating a method of manufacturing a semiconductor package according to an embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various elements, such elements must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

Certain embodiments of the invention will be described below in more detail with reference to the accompanying drawings. Those components that are the same or are in correspondence are rendered the same reference numeral regardless of the figure number, and redundant explanations are omitted.

Figure 5:
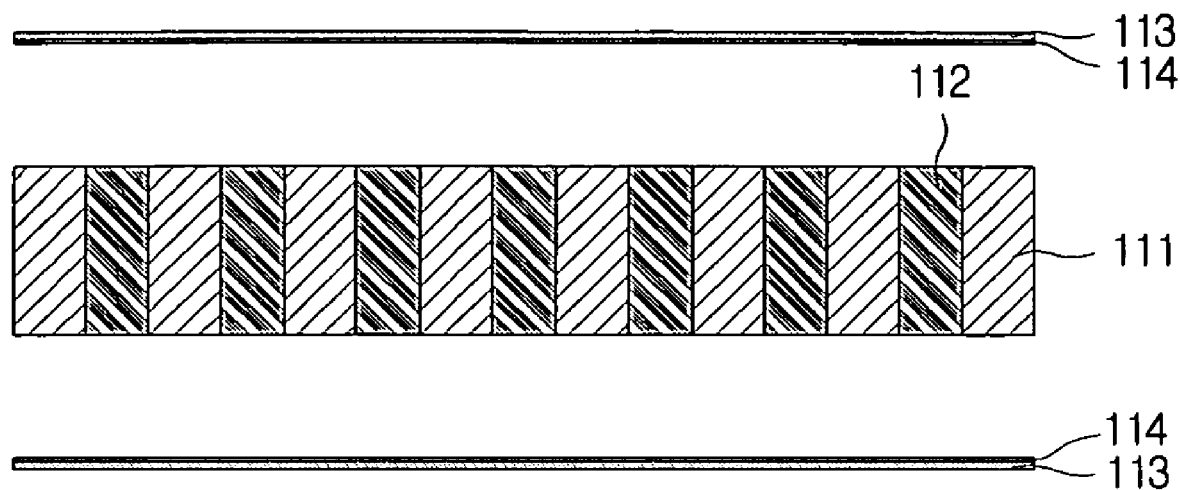
Figure 6:
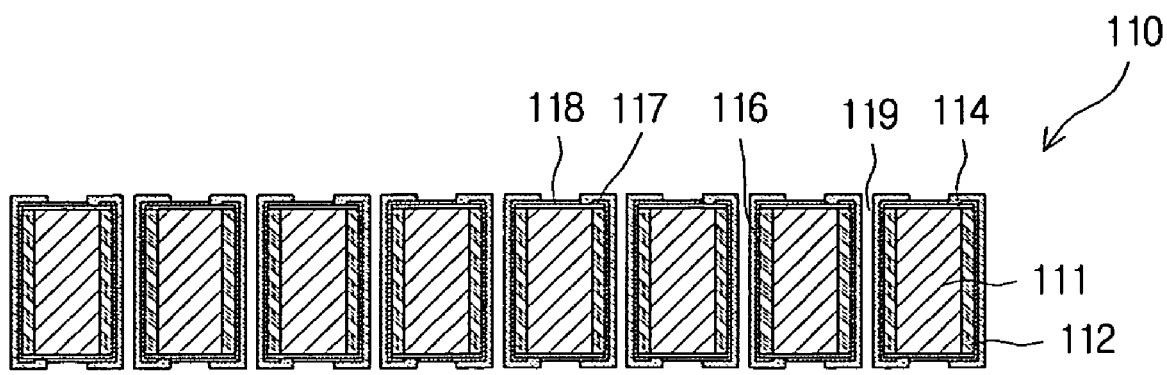
Figure 7:
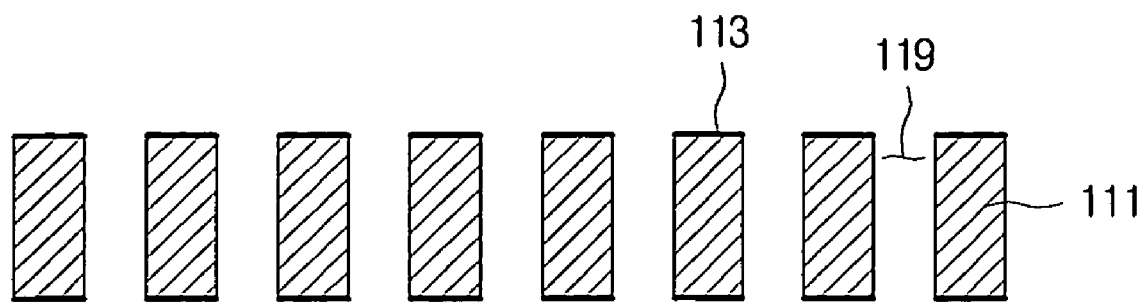
FIG. 7 and FIG. 8 are cross sectional views representing a method of manufacturing a first board according to another embodiment of the invention.
Figure 8:
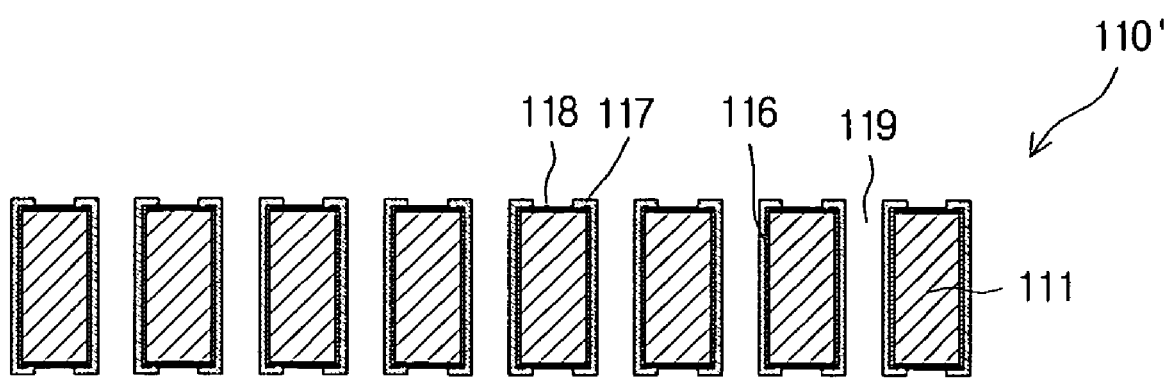
Figure 9:
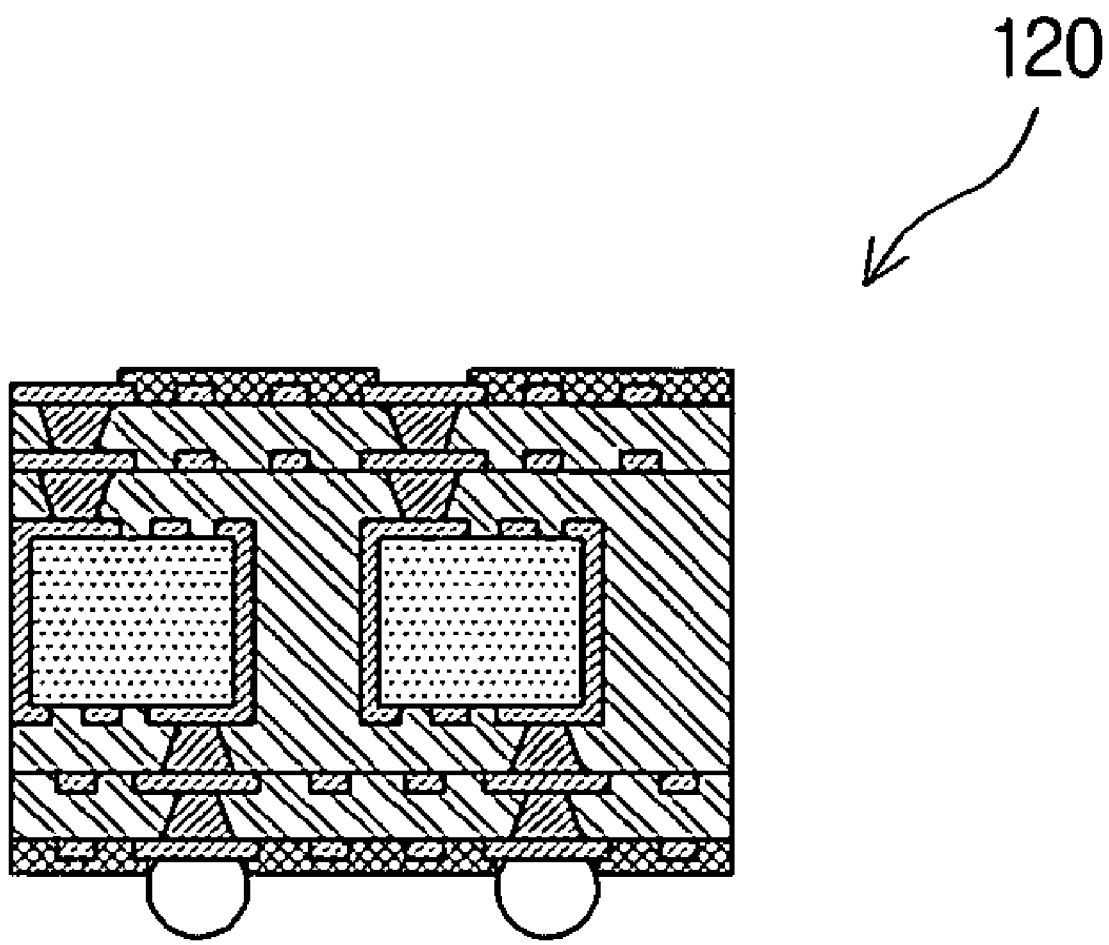
FIG. 9 is a cross sectional view illustrating a second board according to an embodiment of the invention.
Figure 10:
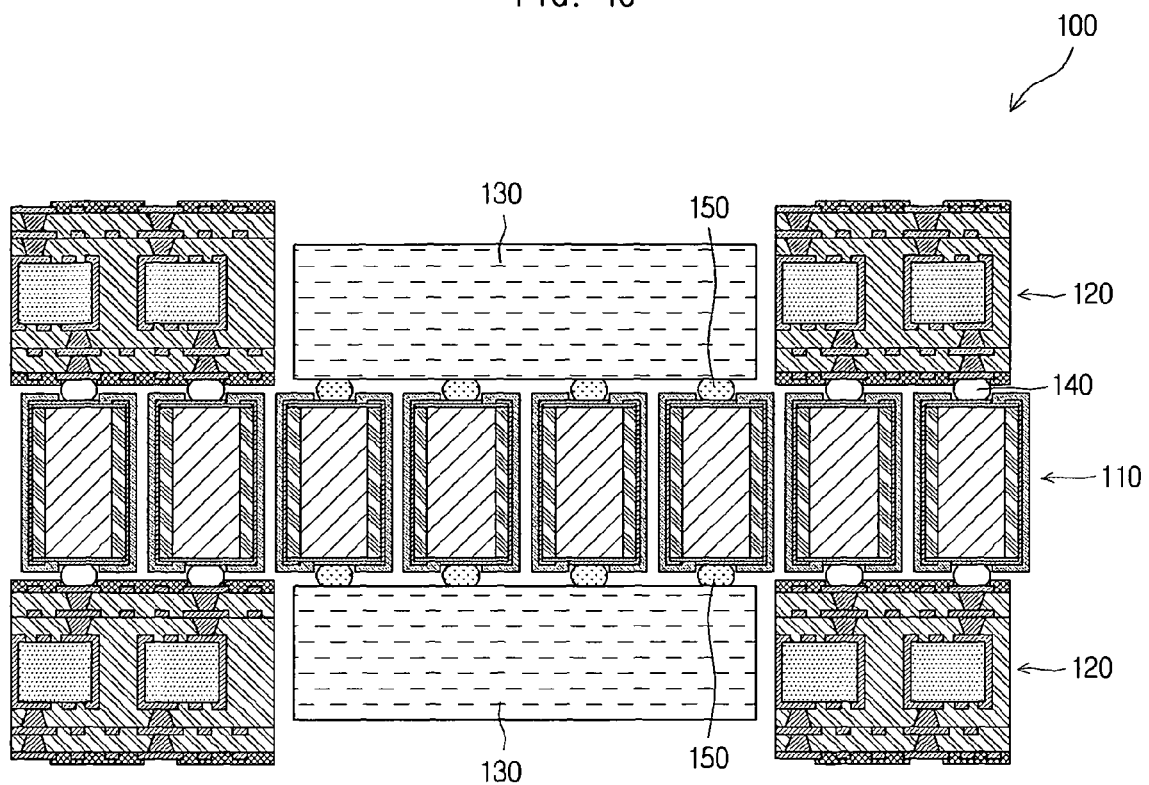
FIG. 10 is a cross sectional view illustrating a semiconductor plastic package according to an embodiment of the invention.
Figure 11:
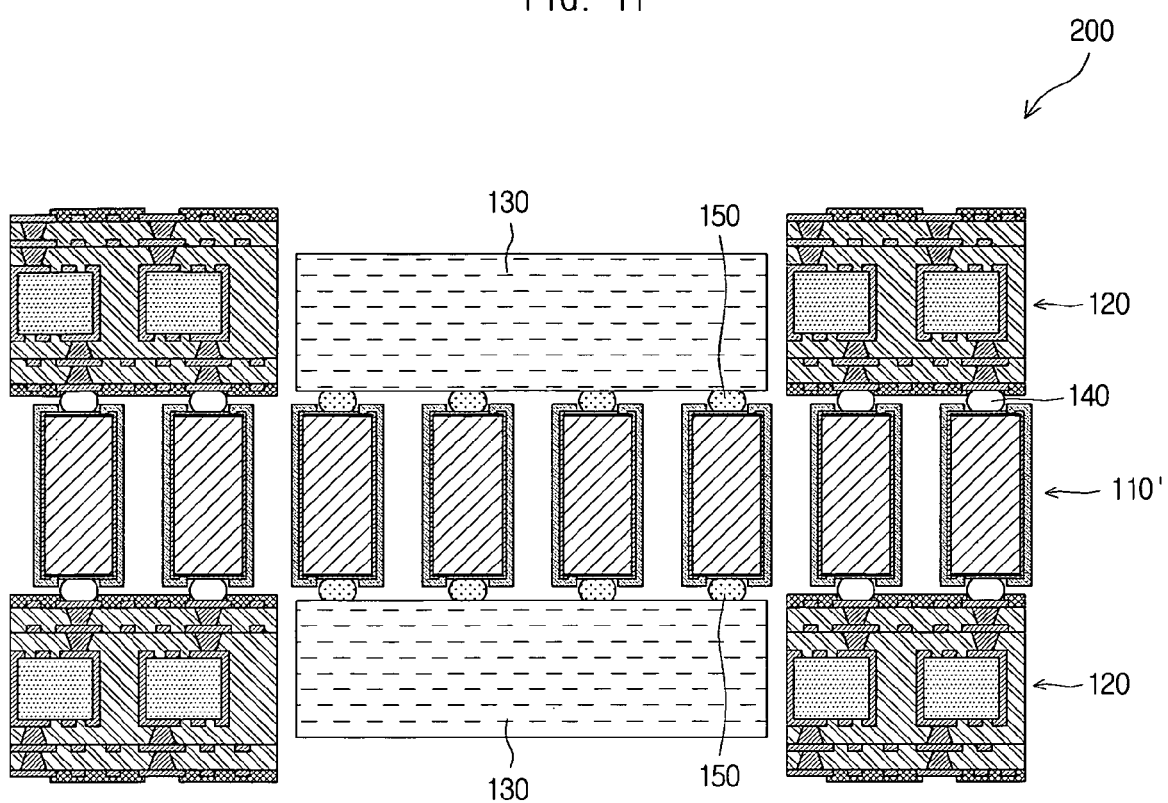
FIG. 11 is a cross sectional view illustrating a semiconductor plastic package according to another embodiment of the invention.

FIG. 1 is a flowchart illustrating a method of manufacturing a semiconductor package according to an embodiment of the invention, FIG. 2 through FIG. 6 are cross sectional views representing a method of manufacturing a first board according to an embodiment of the invention, and FIG. 7 through FIG. 8 are cross sectional views representing a method of manufacturing a first board according to another embodiment of the invention. FIG. 9 is a cross sectional view illustrating a second board according to an embodiment of the invention, FIG. 10 is a cross sectional view illustrating a semiconductor plastic package according to an embodiment of the invention, and FIG. 11 is a cross sectional view illustrating a semiconductor plastic package according to another embodiment of the invention.

This embodiment relates to a method of manufacturing a semiconductor package by attaching boards together that have different rates of thermal expansion, and to a semiconductor plastic package manufactured using this method. The embodiment makes it possible to lower the costs involved in the manufacturing process and improve reliability in the connections between the boards and the components, as well as to prevent cracking in the board and semiconductor chip, by having the connection material mitigate the stresses, and prevent defects such as bending and warpage. Also, damage to the semiconductor chip or bumps can be avoided, which may otherwise be incurred by stresses resulting from temperature cycle tests. If a defect does occur in the board or component, it is possible to remove the faulty board or component for reworking.

In FIGS. 2 to 11, there are illustrated semiconductor plastic packages 100, 200, a first board 110, core boards 111, a resin composition 112, copper foils 113, insulation layers 114, through-holes 115, a copper conductive material 116, circuits 117, lands 118, electrically conductive through-holes 119, second boards 120, components 130, a board connection material 140, and a component connection material 150.

First, a first board 110 may be formed, which can have a rate of thermal expansion of 9 ppm/° C. or lower (S10). In certain examples, the rate of thermal expansion may lie within a range of −15 to 9 ppm/° C. The first board 110 can be a printed circuit board that has a lower coefficient of thermal expansion than do the second boards 120. The rate of thermal expansion of the first board 110 can be 9 ppm/° C. or lower. In some embodiments, the rate of thermal expansion can be between −15 to 7.5 ppm/° C., or even between −10 to 5 ppm/° C. A value outside the ranges described above for the rate of thermal expansion can lead to connection problems in the boards and can cause cracking.

Figure 2:
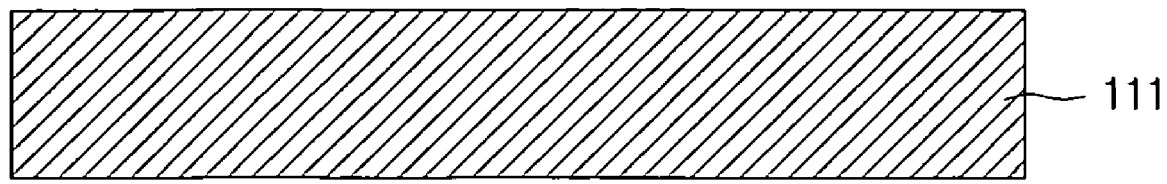
FIG. 2, FIG. 3, FIG. 4, FIG. 5, and FIG. 6 are cross sectional views representing a method of manufacturing a first board according to an embodiment of the invention.
Figure 3:
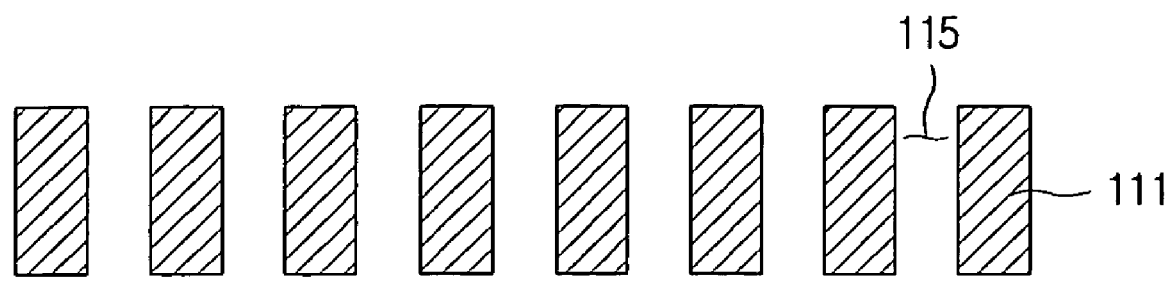
Figure 4:
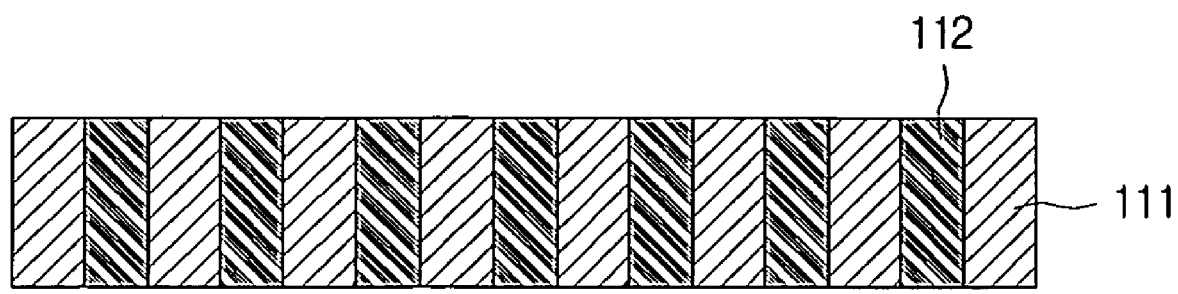

One method of forming the first board 110 may proceed as follows. First, as illustrated in FIG. 2, a core board 111 may be formed (S11), and then, as illustrated in FIG. 3, the core board 111 may be perforated to selectively form through-holes 115 (S12). Next, as illustrated in FIG. 4, a resin composition 112 may be filled in the through-holes 115 (S13), after which copper foils 13, each having a B-stage insulation layer 114 adhered thereto, may be attached to both sides of the core board 111 (S14), as illustrated in FIG. 5. Here, the insulation layers 114 can be made from a thermosetting resin composition.

Next, as illustrated in FIG. 6, the copper foils 13 at the surfaces may be etched, and the resin composition 112 filled in the through-holes 115 may be perforated, to selectively form electrically conductive through-holes 119 (S15). Circuits 117 may be formed over the copper foils 113 at the surfaces and the electrically conductive through-holes 119 (S16), and the electrically conductive through-holes 119 may be plated (S17), to allow the transfer of electrical signals. A solder resist may be attached above and below the fabricated core board 111, with portions uncovered that correspond to lands 118. A surface treatment may be applied over the lands 118, over which the solder resist is uncovered. In this way, a first board 110 can be completed, as in the example illustrated in FIG. 6.

As illustrated in FIGS. 7 and 8, a first board 110' may also be fabricated by forming electrically conductive through-holes 119 in the core board 111, and then etching the copper foils 113 attached to both sides of the core board 111 to form the circuits 117.

The resin used in the first board 110 can be a thermosetting resin, such as epoxy resin, cyanate ester resin, maleimide-cyanate ester resin, benzocyclobutene resin, polyimide resin, cardo resin, and functional-group-containing polyphenylene ether resin, which can be used alone or in a combination of two or more resins.

With the through-holes becoming narrower and narrower, cyanate ester resin and maleimide-cyanate ester resin can advantageously be utilized to prevent migration between circuits. Furthermore, known types of resin, some of which have been listed above, may be used after applying flame-retardant treatment with phosphorus or bromine. While a thermosetting resin according to this embodiment can be hardened by heating the resin as is, this may entail a slow hardening rate and low productivity. Thus, an adequate amount of hardening agent or thermosetting catalyst may advantageously be used in the thermosetting resin.

Various other additives may generally be used in the thermosetting resin. For example, a thermosetting resin, a thermoplastic resin, or another type of resin may be added, other than the main resin used, as well as adequate amounts of an organic or inorganic filler, a dye, pigments, a thickening agent, lubricant, an antifoaming agent, a dispersing agent, leveling agent, brightening agent, and thixotropic agent, etc., according to the purpose and usage of the composition. It is also possible to use a flame retardant, such as those using phosphorus and bromine, and non-halogenated types.

The thermoplastic resin used can be such that is generally known to those skilled in the art. More specifically, liquid crystal polyester resin, polyurethane resin, polyamide-imide resin, polyphenylene ether resin, etc., can be used by itself or in a combination of two or more resins. However, since the printed circuit board may undergo a high-temperature reflow treatment during the process for mounting components, the thermoplastic resin used can be such that has a sufficiently high melting point, so as not to not incur defects in the printed circuit board at the reflow temperatures. In certain examples, the melting point of the thermoplastic resin may be 270° C. or higher. The various additives described above may also be added in adequate amounts to the thermoplastic resin. Furthermore, a thermoplastic resin and a thermosetting resin can be used together in a combination.

Besides the thermosetting resin and thermoplastic resin, other resins may be used alone or in combination, such as UV-setting resins and radical-curable resins, etc. These resins may also be used in combination with the thermosetting resins and thermoplastic resins mentioned above. Also, a photopolymerization initiator, radical polymerization initiator, and/or the various additives described above can be mixed in adequate amounts.

In terms of the reliability of the printed circuit board that can be fabricated according to a certain embodiment of the invention, it may be advantageous to utilize thermosetting resins and heat-resistant thermoplastic resins.

Non-woven or woven fabric of inorganic or organic fibers, or a metallic material may be used as a reinforcement for the first board 110 having a low coefficient of thermal expansion.

The inorganic fibers may include, for example, ceramic fibers, S-glass fibers, and T-glass fibers, etc., which have low coefficients of thermal expansion. The organic fibers may include poly oxibenzazole fibers, aromatic polyaramid fibers, liquid crystal polyester fibers, and carbon fibers, etc., which have low coefficients of thermal expansion and which are resistant to heat.

A film having a low coefficient of thermal expansion, such as aromatic polyaramid film, poly oxibenzazole film, and liquid crystal polyester film, etc., can be used as a reinforcement material. In order to improve the adhesion between the reinforcing material and the resin, a surface treatment known to those skilled in the art may be applied to the reinforcing material. Examples may include silane coupling agent treatment for glass fiber materials, and corona treatment, various chemical treatments, blast treatment, and plasma treatment, etc., for film materials.

In the case of film materials, the copper foils may be attached by way of adhesive applied onto either side of the film, or a copper laminated sheet may be used in which the copper foils are attached directly by a method known to those skilled in the art. In terms of lowering the coefficient of thermal expansion, the latter method may provide more desirable results.

The organic fibers may form an aromatic polyaramid non-woven or woven fabric reinforcement.

The metallic material may also be such that has a low coefficient of thermal expansion. For example, the metal material may be Invar or copper-Invar, etc. A printed circuit board having a low coefficient of thermal expansion according to an embodiment of the invention can be a printed circuit board having two or more metal circuit layers, and in mounting a component in the printed circuit board, it can be important that the coefficients of thermal expansion not be significantly different between the printed circuit board and the component. If a multi-layer board having two or more layers is to be manufactured, it can be advantageous to use a metallic material in the core board to decrease the number of layers. Here, the overall rate of thermal expansion of the core board using metal can be 9 ppm/° C. or lower, or more desirably, −15 to 7.5 ppm/° C. In certain embodiments, the overall rate of thermal expansion can even be between −10 to 5 ppm/° C.

The printed circuit board for the first board 110 may also be implemented using glass fibers or ceramic materials that have low coefficients of thermal expansion. Even when the printed circuit board is fabricated to have a low rate of thermal expansion, if the printed circuit boards attached on the outer sides by way of a conductive material have relatively high coefficients of thermal expansion, ranging from 10 to 25 ppm/° C., for example, there may be a tendency to expand in the lateral and longitudinal directions when heat is applied. In actuality, the entire printed circuit board configuration may expand and contract in accordance with the expansion and contraction of the outer printed circuit boards, which may have higher rates of thermal expansion. Although this may be greater than the rate of thermal expansion in only the inner printed circuit board having a low coefficient of thermal expansion, the conductive material attached to the printed circuit board having a low rate of thermal expansion, i.e. to the printed circuit board to which the components may be mounted and connected, may mitigate the stresses, so that the degree of expansion and contraction may be lessened.

As such, the printed circuit board having a low rate of thermal expansion, to which the internal components may be mounted and connected, may not expand as much, and therefore it will be more difficult for defects to occur, such as cracking or detaching, etc., of the component or connection material. The sizes of the printed circuit boards having relatively higher coefficients of thermal expansion, attached to the outer sides in this configuration, may be smaller than or equal to the size of the inner printed circuit board having a low rate of thermal expansion.

However, the printed circuit boards having relatively higher coefficients of thermal expansion, which may be attached to the upper and lower sides, can be such that have the same rate of thermal expansion. By attaching the printed circuit boards in corresponding positions on the upper and lower sides, bending and warpage may be prevented. As these printed circuit boards have a higher coefficient of thermal expansion and are thus generally less expensive than the printed circuit board having a low rate of thermal expansion to which the components may be mounted and connected, the overall cost can be reduced.

The method of manufacturing the printed circuit board having a low coefficient of thermal expansion in this embodiment of the invention may vary according to the types of material used, and any method known to those skilled in the art may be employed. The material used can be such that has a rate of thermal expansion of 9 ppm/° C. or lower. In certain cases, a material may be selected with which to provide the printed circuit board with a rate of thermal expansion of −15 to 7.5 ppm/° C., and in some cases, −10 to 5 ppm/° C. In certain cases where a woven or non-woven fabric of an aromatic polyaramid in a para- or meta-substitution is used, an insulating material may be impregnated in the fibers and dried, to obtain a B-stage resin, and copper foils may be stacked and molded on both sides to form a double-sided copper clad laminate.

Through-holes may be formed in this double-sided copper clad laminate using a laser, after which desmearing, copper plating, and circuit forming processes, etc., may be applied, to form a printed circuit board. A copper clad laminate using T-glass fiber or S-glass fiber woven fabric may also be manufactured into a printed circuit board in substantially the same manner. In such cases, the through-holes may also be processed using a mechanical drill. The rate of thermal expansion of this double-sided copper clad laminate may vary according to the type and amount of reinforcement impregnated in the resin. Generally, the greater the amount of reinforcement material included, the lower the rate of thermal expansion. An adequate composition may provide the double-sided copper clad laminate with a rate of thermal expansion of 9 ppm/° C. or lower, or more advantageously, −15 to 7.5 ppm/° C. A rate of thermal expansion lying within the range of −10 to 5 ppm/° C. may be even more desirable.

In certain cases where carbon fiber woven fabric is used, an insulating material can be impregnated in the fibers and dried, to obtain a B-stage resin, and copper foils may be stacked and molded on both sides to form a double-sided copper clad laminate. Afterwards, through-holes may be formed using a laser, with the diameters of the through-holes made greater than those of the electrically conductive through-holes that will be implemented.

Next, the through-holes may be filled with a resin composition, which may then be hardened. Portions of the resin composition protruding from the surface can be polished to level the surface. Afterwards, the center of the resin composition may again be processed with a laser, without touching the carbon fiber woven fabric, to obtain electrically conductive through-holes, which may be followed by desmearing, copper plating, and circuit forming, etc., to form a low thermal expansion printed circuit board.

In certain cases where glass fibers are used, the through-holes can be formed by a method known to those skilled in the art using a laser or a chemical such as hydrofluoric acid, etc. Afterwards, a thin copper layer may be formed by sputtering over the entire surface, and a thick copper plating layer may be formed such as by copper electroplating, and then circuits may be formed, etc., to fabricate a low thermal expansion printed circuit board.

In certain cases where Invar or copper-Invar is used, through-holes may be processed which are slightly larger than the electrically conductive through-holes which will be implemented, using a laser, for example. Then, a thin copper layer may be formed by sputtering, etc., over the entire configuration, the through-holes may be filled in with a resin composition, and then the resin composition may be hardened. Copper foils, each having a thin B-stage insulation layer attached thereto, may be arranged at the upper and lower sides of the configuration, which may then be stacked and molded. The center of the resin composition may be processed, without touching the Invar or copper-Invar, to provide electrically conductive through-holes having diameters smaller than those of the original through-holes. Desmearing, electroless copper plating, and copper electroplating processes, etc., may then be applied to the electrically conductive through-holes, and circuits may be formed, to provide a low thermal expansion printed circuit board.

In cases where a resin composition is attached directly onto the surfaces of the Invar or copper-Invar, the degree of roughness can be increased in the surfaces of the Invar or copper-Invar, using a chemical treatment, etc., known to those skilled in the art, so as to improve the adhesion to the resin composition. The method of manufacturing a printed circuit board having a low rate of thermal expansion printed circuit board is not limited to the examples described above, and any of various other methods known to those skilled in the art may be used just as well.

Next, as illustrated in FIG. 9, second boards 120 may be formed, of which the rate of thermal expansion may lie within a range of 10 to 25 ppm/° C., and in which cavities 160 may be formed (S20).

The printed circuit boards, i.e. the second boards 120, which may be attached to the outer sides of the inward low thermal expansion printed circuit board, i.e. the first board 110, can be such that have a relatively higher coefficient of thermal expansion than that of the printed circuit board having a low coefficient of thermal expansion.

Examples of a printed circuit board having a relatively higher coefficient of thermal expansion here may include those printed circuit boards which have coefficients of thermal expansion between 10 and 25 ppm/° C. The printed circuit board may not necessarily be limited to a particular material, and any of the materials and reinforcement, such as the resins and additives, etc., mentioned above, can be used. In terms of lower costs, however, it may be advantageous to use E-glass fiber woven fabric as the reinforcement material for the printed circuit board. The number of printed circuit boards having a higher coefficient of thermal expansion may vary according to the usage and design, so that a multi-layer printed circuit board having two or more layers may be manufactured. For example, a multi-layer printed circuit board may be manufactured with its major functions implemented in four or more layers. While this printed circuit board is not limited to a particular thickness, it can be advantageous to have the combined height of the components and connection materials, if there are components mounted and connected, be equal to or smaller than the combined height of the connection material and the printed circuit boards having a higher coefficient of thermal expansion, after attaching the printed circuit boards.

In this way, the components can be prevented from protruding outwards from the surfaces of the printed circuit boards having a relatively higher coefficient of thermal expansion, and damage may be avoided that may otherwise occur due to pressures applied from the sides of each of the components, etc. However, care may be needed not to subject the package to pressure from the two directions in which the printed circuit boards having relatively higher coefficients of thermal expansion are not connected. If the connection material is made of a material that enables reworking, such as lead-free solder, etc., the printed circuit board configuration can be reworked in the event of a defect, to provide benefits in terms of costs. In addition, there is a reduced risk of cracking damage, etc., in the component or the connection material, when the component is mounted and connected to a printed circuit board having a low rate of thermal expansion, so that it may not be necessary to use an underfill. If a defect occurs in a component, the component may be reworked and replaced, allowing advantages in cost saving.

In the printed circuit boards having a relatively higher coefficient of thermal expansion that are attached to either side of a low thermal expansion printed circuit board, openings may be formed in positions where the components are to be mounted and connected, to sizes slightly larger than the areas occupied by the components. The opening is not limited to a particular size, and a cavity can generally be formed to be 1 to 3 mm larger from each side of the embedded component.

The forming of the cavities is not limited to a particular method, and can be performed by any of various methods using routers, punches, lasers, and water jets, etc. The components can be held inside the cavities, and mounted on and connected to the inner printed circuit board having a low coefficient of thermal expansion. This may be performed by a method known to those skilled in the art, such as methods using gold bumps, lead-free solder, regular solder, etc. The mounting and connecting of the components may be performed before or after attaching the outer printed circuit boards having a relatively higher coefficient of thermal expansion to the low thermal expansion printed circuit board.

When manufacturing the printed circuit board having a relatively higher coefficient of thermal expansion, it is not necessary to use the same resin compositions described above. For example, the inner core board can be implemented using a copper clad laminate made of an E-glass fiber woven fabric reinforcement and an epoxy resin composition, while the build-up insulation material can be selected from various alternatives such as a copper foil sheet having a B-stage cyanate ester resin composition attached without a separate reinforcement material, a B-stage unsaturated-group-containing polyphenylene ether resin sheet, and a B-stage resin sheet containing various additional materials.

Next, as illustrated in FIGS. 10 and 11, each of the second boards 120 may be attached to either side of the first board 110 using a board connection material 140, in such a way that the second boards 120 are electrically connected to the first board 110 (S30). Then, the components 130 embedded in the respective cavities may be connected with the first board 110 by a flip chip method, using a component connection material 150 between the components 130 and the first board 110 (S40).

FIG. 10 shows a semiconductor plastic package 100 manufactured using a first board 110 that was fabricated by a method represented in FIGS. 2 to 6.

FIG. 11 shows a semiconductor plastic package 200 manufactured using a first board 110' that was fabricated by a method represented in FIGS. 7 and 8.

The number of printed circuit boards having a higher coefficient of thermal expansion, i.e. the second boards, may vary according to the usage and design, and a multi-layer printed circuit board having two or more layers may be manufactured. For example, a multi-layer printed circuit board may be manufactured with its major functions implemented in four or more layers. While the printed circuit board is not limited to a particular thickness, it can be advantageous to have the combined height of the components and connection materials, if there are components mounted and connected, be equal to or smaller than the combined height of the connection material and the printed circuit boards having a higher coefficient of thermal expansion, after attaching the printed circuit boards. In this way, the components can be prevented from protruding outwards from the surfaces of the printed circuit boards having a relatively higher coefficient of thermal expansion, and damage may be avoided that may otherwise occur due to pressures applied from the sides of each of the components, etc.

In the printed circuit boards having a relatively higher coefficient of thermal expansion, i.e. the second boards, that are attached to either side of a low thermal expansion printed circuit board, i.e. the first board, openings may be formed in positions where the components are to be mounted and connected, to sizes slightly larger than the areas occupied by the components. The opening is not limited to a particular size, and a cavity can generally be formed to be 1 to 3 mm larger from each side of the embedded component. The forming of the cavities is not limited to a particular method, and can be achieved using any of a variety of methods using routers, punches, lasers, and water jets, etc.

The connecting between the printed circuit boards having a relatively higher coefficient of thermal expansion and the printed circuit board having a low rate of thermal expansion on which to connect the components is not limited to a particular method. It will be advantageous to choose a connecting method that provides a connection which can withstand reliability tests. Examples of such a method may include methods using electrically conductive adhesive, lead-free solder, regular solder, and metal pins, etc.

The connection material for the low thermal expansion printed circuit board and the printed circuit boards on both outer sides having a relatively higher coefficient of thermal expansion can be an electrically conductive adhesive. The electrically conductive adhesive may be such that has a sufficiently low resistance to allow a satisfactory transmission of electrical signals.

This electrically conductive adhesive can be composed mainly of electrically conductive particles and a binder resin composition, and can be given an elastic quality by mixing in a resin composition, such that the electrically conductive adhesive may expand or contract when heated or cooled. Thus, the electrically conductive adhesive can mitigate the longitudinal and lateral stresses caused by the differences in thermal expansion between each printed circuit board during heating or cooling, whereby detaching or damage in the connection material may be avoided.

The type of electrically conductive adhesive can be selected according to the rate of thermal expansion of each printed circuit board. The electrically conductive adhesive can be silver paste, copper paste, etc., for example, but is not thus limited.

In certain embodiments of the invention, the low thermal expansion printed circuit board, to which components may be mounted and connected, and the less expensive printed circuit boards that have a relatively higher coefficient of thermal expansion, which may be implemented to perform the major functions, can be fabricated separately and connected together. Since the rates of thermal expansion may not be significantly different between the components and the low thermal expansion printed circuit board, even during heating or cooling, defects may be avoided that may otherwise be incurred by expanding and contracting stresses.

Also, an electrically conductive adhesive, etc., that is capable of mitigating stresses can be used as the connection material between the low thermal expansion printed circuit board and the printed circuit boards on either side having a relatively higher coefficient of thermal expansion. In this way, the connection material can be largely unaffected by the expanding and contracting stresses during heating and cooling, so that defects such as cracking and detaching, etc., can be prevented in the connection material.

In other words, although the connection material may be subject to stresses from each of the components and printed circuit boards, the stresses may be dispersed by the connection material, so that a higher reliability can be obtained during reliability tests, such as temperature cycle tests, etc., compared to other multi-layer printed circuit boards. Decreasing the coefficient of thermal expansion over the whole of a multi-layer printed circuit board may entail forming the entire printed circuit board configuration using high-cost, expensive materials. This can raise manufacturing costs, whereby the completed multi-layer printed circuit board may also be made expensive. The connection material for use in an embodiment of the invention may also be selected in consideration of allowing reworking for the multi-layer printed circuit board.

The connecting between low thermal expansion printed circuit board and the outer printed circuit boards having a relatively higher coefficient of thermal expansion is neither limited to a particular method nor a particular material. The connection method may employ a material known to those skilled in the art, including electrically conductive adhesive, lead-free solder, regular solder, and metal pins, etc., as long as it provides a desired level of reliability.

A multi-layer printed circuit board according an embodiment of the invention can be a printed circuit board for mounting and connecting components. Of course, the multi-layer printed circuit board can be of a structure that also allows wire bonding connections.

Figure 12:
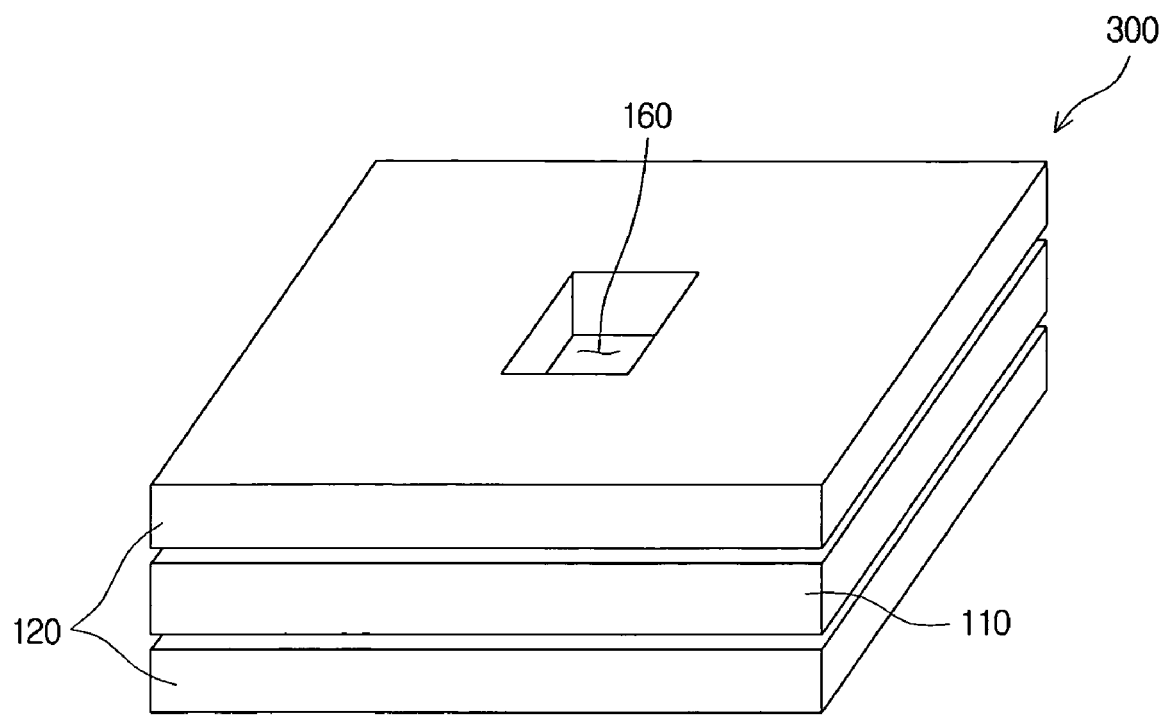
FIG. 12 is a perspective view illustrating a semiconductor plastic package according to an embodiment of the invention.
Figure 13:
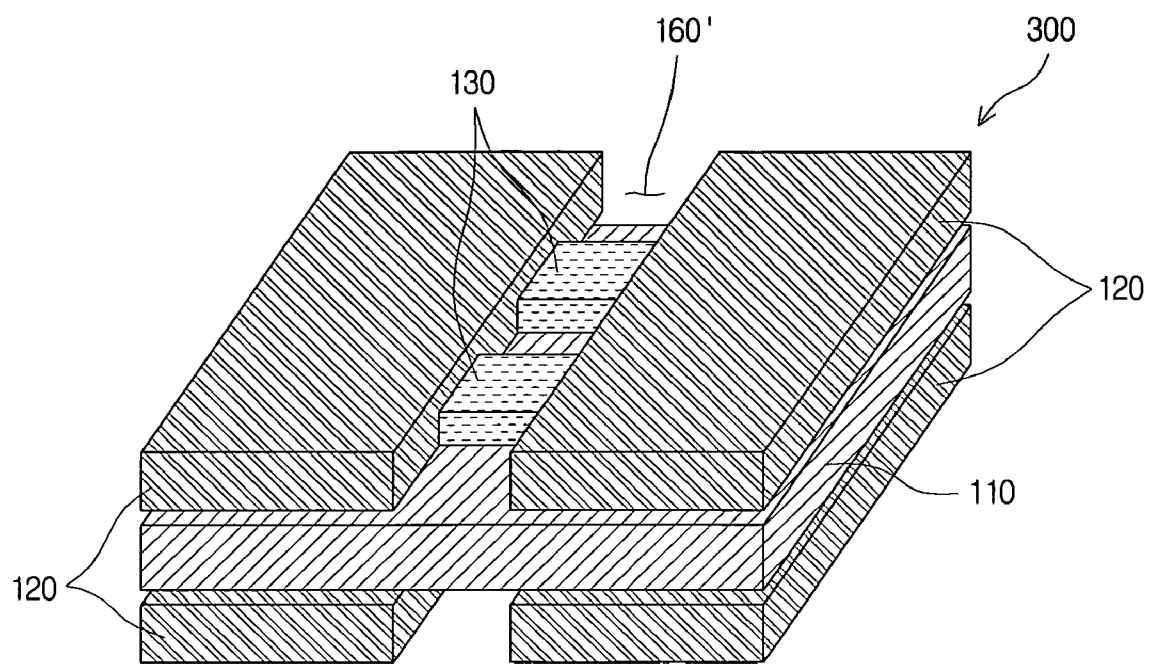
FIG. 13 is a perspective view illustrating a semiconductor plastic package according to another embodiment of the invention.
Figure 14:
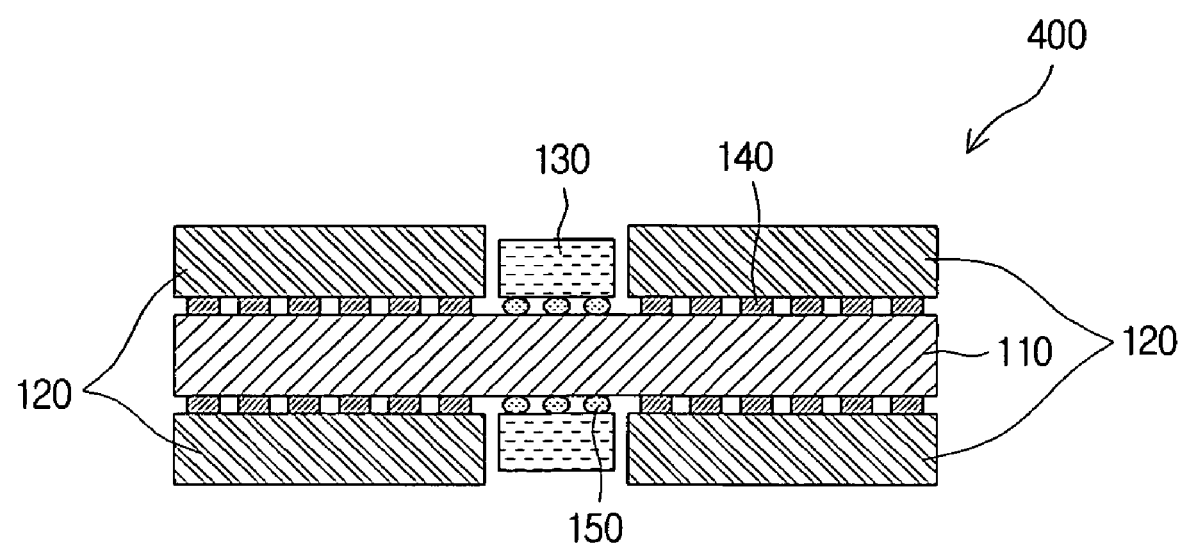
FIG. 14 is a cross sectional view schematically illustrating a semiconductor plastic package according to an embodiment of the invention.

FIG. 12 is a perspective view illustrating a semiconductor plastic package according to an embodiment of the invention, FIG. 13 is a perspective view illustrating a semiconductor plastic package according to another embodiment of the invention, and FIG. 14 is a cross sectional view schematically illustrating a semiconductor plastic package according to an embodiment of the invention.

In FIGS. 12 and 14, there are illustrated semiconductor plastic packages 300, 400, first boards 110, second boards 120, components 130, a board connection material 140, a component connection material 150, cavities 160, and apertures 160'.

The first board 110 can be a printed circuit board that has a lower coefficient of thermal expansion than do the second boards 120. The rate of thermal expansion of the first board 110 can be 9 ppm/° C. or lower. In some embodiments, the rate of thermal expansion can be between −15 to 7.5 ppm/° C., or even between −10 to 5 ppm/° C. A value outside the ranges described above for the rate of thermal expansion can lead to connection problems in the boards and can cause cracking.

The first board 110 can include any one of a thermosetting resin, thermoplastic resin, UV-curable resin, and radical-curable resin, and can also include any one of a non-woven or woven fabric of inorganic/organic fibers and a metal.

The resin used in the first board 110 can be a thermosetting resin, such as epoxy resin, cyanate ester resin, maleimide-cyanate ester resin, benzocyclobutene resin, polyimide resin, cardo resin, and functional-group-containing polyphenylene ether resin, which can be used alone or in a combination of two or more resins.

Non-woven or woven fabric of inorganic or organic fibers, or a metallic material may be used as a reinforcement for the first board 110 having a low coefficient of thermal expansion.

The inorganic fibers may include, for example, ceramic fibers, S-glass fibers, and T-glass fibers, etc., which have low coefficients of thermal expansion. The organic fibers may include poly oxibenzazole fibers, aromatic polyaramid fibers, liquid crystal polyester fibers, and carbon fibers, etc., which have low coefficients of thermal expansion and which are resistant to heat.

A film having a low coefficient of thermal expansion, such as aromatic polyaramid film, poly oxibenzazole film, and liquid crystal polyester film, etc., can be used as a reinforcement material. In order to improve the adhesion between the reinforcing material and the resin, a surface treatment known to those skilled in the art may be applied to the reinforcing material. Examples may include silane coupling agent treatment for glass fiber materials, and corona treatment, various chemical treatments, blast treatment, and plasma treatment, etc., for film materials.

The organic fibers may form an aromatic polyaramid non-woven or woven fabric reinforcement.

The metallic material may also be such that has a low coefficient of thermal expansion. For example, the metal material may be Invar or copper-Invar, etc. A printed circuit board having a low coefficient of thermal expansion according to an embodiment of the invention can be a printed circuit board having two or more metal circuit layers, and in mounting a component in the printed circuit board, it can be important that the coefficients of thermal expansion not be significantly different between the printed circuit board and the component. If a multi-layer board having two or more layers is to be manufactured, it can be advantageous to use a metallic material in the core board to decrease the number of layers. Here, the overall rate of thermal expansion of the core board using metal can be 9 ppm/° C. or lower, or more desirably, −15 to 9 ppm/° C. In certain embodiments, the overall rate of thermal expansion can even be between −10 to 5 ppm/° C.

As illustrated in FIG. 12, each of the second boards 120 may be attached to either side of the first board 110 in electrical connection with the first board 110, with cavities 160 formed in each of the second boards 120, in which the components 130 may be embedded. The component 130 will be described later in further detail. The rates of thermal expansion of the second boards 120 may be within a range of 10 and 25 ppm/° C., and may thus be greater than the rate of thermal expansion of the first board 110.

Alternately, each of the second boards 120 may be attached to either side of the first board 110, to be electrically connected with the first board 110, and apertures 160' may be formed in which the components 130 described later may be embedded, as illustrated in FIG. 13. The aperture 160' can be formed in a way that disconnects the second board 120. Thus, when the semiconductor plastic package is heated, the second boards 120 having higher coefficients of thermal expansion may not overly apply pressure on the semiconductor chips 130.

A value outside the ranges described above for the rate of thermal expansion of a second board 120 can lead to cracking between the boards and create problems in reliability.

The second boards 120, which have a high coefficient of thermal expansion, may generally be less expensive than the first board 110, which has a low coefficient of thermal expansion. As such, by forming the second boards 120 over both sides of the first board 110, the manufacturing cost of the board overall can be reduced.

The second board 120 can use E-glass fibers as a reinforcement material, and can be stacked in two or more layers to implement a multi-layer printed circuit board. Also, cavities 160 may be formed in the second boards 120, in which to embed the components 130. The size to which a cavity 160 may be opened is not limited to a particular value, and the cavity 160 can generally be processed to be opened 1 to 3 mm larger from the perimeter of the component 130. The forming of the cavities is not limited to a particular method, and can be performed using any of a variety of methods, such as those using routers, punches, lasers, and water jets, etc.

The inner core board of a second board 120 can be implemented using an epoxy resin composition containing E-glass fibers, while the build-up insulation material can be selected from various alternatives, such as a copper foil sheet having a B-stage cyanate ester resin composition attached without a separate reinforcement material, a B-stage unsaturated-group-containing polyphenylene ether resin composition sheet, and a B-stage resin composition sheet, etc.

The components 130 may be embedded in the respective cavities 160 formed in the second boards 120, and may be connected with the first board 110 by a flip chip method. A component 130 can be, for example, a semiconductor chip.

When the components 130 are mounted on and connected to the first board 110, the combined thickness of a component 130 and the component connection material can be made thinner than the combined thickness of the second board 120 and the board connection material, as illustrated in FIG. 13. Thus, when the components 130, including the component connection material, are embedded in the cavities 160 of the second boards 120, the heights of the embedded components 130 may be lower than the height of the second board 120, including the board connection material. In this way, the components 130 may not be higher than the thickness of the second board 120 having a higher rate of thermal expansion, and thus may be prevented from protruding above the second board 120 and from being damaged by pressure applied from the sides. This can further reduce the occurrence of defects. Also, in cases where the board connection material and component connection material are made from materials that allow reworking, such as solder, etc., it may be possible to separate the defective component or printed circuit board for reworking, allowing further benefits in terms of costs.

Of course, the thickness of a component 130 can also be made substantially equal to the thickness of the second board 120.

A board connection material 140 may be interposed between the first board 110 and the second boards 120, to electrically connect the first board 110 with the second boards 120.

A component connection material 150 may be interposed between the first board 110 and the components 130, to electrically connect the first board 110 with the components 130.

Here, each of the board connection material 140 and the component connection material 150 can be formed as bumps or as an electrically conductive adhesive, etc., made from various constituents. An electrically conductive adhesive may include silver paste or copper paste, etc.

To be more specific, the board connection material 140 and the component connection material 150 may be implemented as regular solder bumps, lead-free solder bumps, or an electrically conductive adhesive, etc.

As the second boards 120, which have a higher rate of thermal expansion, may be mounted over the first board 110, which has a lower rate of thermal expansion, heating the overall board configuration can cause the second boards 120 having the higher rate of thermal expansion to expand in the lateral and longitudinal directions.

However, the second boards 120 and first board 110 may be connected together by way of the board connection material 140, which may be an electrically conductive adhesive. Thus, when the board configuration is heated or cooled, the stresses caused by the different rates of thermal expansion in the first board 110 and second boards 120 may be mitigated by the board connection material 140.

As such, the first board 110 may not expand or contract as much as the second boards 120 during heating or cooling, and the board connection material 140 may prevent cracking and detaching. The electrically conductive adhesive can be one of silver paste and copper paste, etc.

The component connection material 150 may also mitigate stresses between the components 130 and the first board 110, to prevent cracks, etc., in the overall printed circuit board configuration and in the components.

If the board connection material 140 and component connection material 150 are materials that enable reworking, such as regular solder and lead-free solder, etc., the printed circuit board configuration can be reworked in the event of a defect, to provide benefits in terms of costs.

As described above, the high thermal expansion second boards 120 and the low thermal expansion first board 110 can be fabricated separately, and the components 130 can be connected with the first board 110 by way of the component connection material 150. Then, the stresses resulting from the different rates of thermal expansion between the components 130 and the first board 110, when the printed circuit board is heated or cooled, can be mitigated by the component connection material 150, to thereby prevent cracking in the components 130 and the first board 110 and generally prevent defects.

Also, by connecting the first board 110 and the second boards 120 using the board connection material 140, the stresses resulting from the difference in rates of thermal expansion between the first board 110 and the second boards 120 can be mitigated by the board connection material 140. Thus, cracking in the first board 110 and second boards 120 can be prevented, to generally prevent defects.

Here, the board connection material 140 may be implemented as an electrically conductive adhesive, which may be largely unaffected by expansion or contraction stresses even when the printed circuit board configuration expands or contracts due to heating or cooling. Therefore, defects involving the occurrence of cracking or detaching of the board connection material 140 can be suppressed.

The forming of a multi-layer printed circuit board using only boards having low rates of thermal expansion can require high costs. Thus, forming the first board 110 from a board having a low rate of thermal expansion and forming the second boards 120 from boards having a high rate of thermal expansion can lead to cost savings for the overall multi-layer printed circuit board, as well as to improvements in reliability.

Manufacture Example 1

Manufacture of a Second Board Having a High Coefficient of Thermal Expansion for Connecting to an Outside of a Printed Circuit Board Having a Low Coefficient of Thermal Expansion For a 0.2 mm non-halogen type epoxy-based double-sided copper clad laminate (product code: R-1515T, CTE: $\alpha 1$ (12 ppm/° C.), Matsushita Electric Works, Ltd.) having copper foils deposited to a thickness of 12 μm on both sides, the copper foils were etched to a thickness of 1.2 μm. Afterwards, through-holes were formed using a mechanical drill to a diameter of 150 μm, desmearing treatment was applied, an electroless-plated copper layer of 0.9 μm thickness and an electroplated copper layer of 20 μm thickness were deposited on each side, and circuits were formed using a subtractive method to line/space widths of 40/40 μm. After applying a black copper oxide treatment to this configuration, one 40 μm-thick layer of non-halogen type epoxy based prepreg (product code: GEA-679FGR, Hitachi Chemical Co.) was arranged on either side, and a 12 μm-thick layer of electro-deposited copper was arranged respectively on the outer side. These were stacked and molded in a 200° C., 25 kgf/cm$^2$, 2 mmHg vacuum for 90 minutes, to fabricate a four-layer double-sided copper clad laminate. The copper foils on the surface layers of this copper clad laminate were etched to a 1.2 μm thickness, blind via holes of 50 μm diameter were formed on both sides using UV-YAG laser, a desmearing treatment was applied, and the holes were filled with copper plating, and circuits were formed on the surfaces. These procedures were repeated to obtain a six-layer printed circuit board. The connection lands were formed with a 425 μm pitch and 150 μm diameter. Over either surface of this copper clad laminate, a typical UV-thermosetting solder resist (product code: PSR4000AUS308, Taiyo Ink Mfg. Co., Ltd.) was formed to a thickness of 15 μm, after which nickel plating and gold plating were performed to 5 μm and 0.2 μm, respectively, to form a multi-layer printed circuit board A. The lands were opened to a diameter of 100 μm. In this multi-layer printed circuit board A, a 12×12 mm portion was opened using a router, in which to hold, mount, and connect a 10×10 mm flip chip. The coefficient of thermal expansion of this multi-layer printed circuit board A was 20.4 ppm/° C. and 22.0 ppm/° C. in the longitudinal and lateral directions, respectively.

Manufacture Example 2

Manufacture of a Low Thermal Expansion First Board Using Copper-Invar

In a copper-Invar laminate of 0.4 mm thickness (Cu/Invar/Cu thicknesses: 2 μm/396 μm/2 μm), through-holes were formed using UV-YAG laser to a diameter of 200 μm, and a copper layer of 722 Å thickness was deposited over all of the surfaces of the copper-Invar laminate using sputtering. A resin composition (product code: FP-R200, $T_g$: 179° C., Asahi Chemical Research Laboratory Co., Ltd.) was filled in only the hole portions using screen printing, and excess resin was wiped off, after which the resin composition was hardened at a temperature of 140° C. for 50 minutes and at a temperature of 155° C. for 1 hour. A copper foil (product code: CRS-501, thickness: 12 μm, Mitsubishi Gas Chemical Company, Inc.) having a B-stage thermosetting resin composition of 10 μm thickness attached thereto can be arranged on each side of this configuration, to be stacked and molded in a 190° C., 20 kg/cm², 2 mmHg vacuum for 90 minutes. The copper foils on the surface layers of this copper Invar laminate were etched to a 1 μm thickness. The centers of the through-holes filled with resin were opened using $CO_2$ laser to form electrically conductive through-holes having a diameter of 100 μm. Afterwards, an electroless-plated copper layer of 1.2 μm thickness and an electroplated copper layer of 15 μm thickness were deposited, circuits were formed on the surfaces, and connection lands were implemented. A thermosetting liquid solder resist was coated over all of the surfaces, including the insides of the holes, to a thickness of 10 to 15 μm, and was then hardened at 150° C. for 1 hour. Then, 100 μm lands were opened using UV-YAG laser, a plasma treatment was applied, and nickel plating and gold plating were performed, respectively, to form a low thermal expansion printed circuit board B. The coefficient of thermal expansion of this printed circuit board B, in the areas for mounting and connecting the components, was 2.4 ppm/° C. in both the longitudinal and lateral directions.

Manufacture Example 3

Manufacture of a Low Thermal Expansion First Board Using a Liquid Crystal Polyester Resin Composition For eight layers of a 50 μm liquid crystal polyester resin sheet (product code: FA film, coefficient of thermal expansion: −11 ppm/° C., melting point: 280° C., Kuraray Co., Ltd.), 12 μm-thick layers of electro-deposited copper were arranged on both sides, and the configuration was stacked and molded in a 290° C., 20 kgf/cm², 2 mmHg vacuum for 20 minutes, to fabricate a copper clad laminate having a thickness of 0.4 mm. The copper foils on both sides were etched to a thickness of 1.2 μm. Afterwards, through-holes were formed using a mechanical drill to a diameter of 150 μm, and a desmearing treatment was applied using plasma. After performing electroless copper plating and copper electroplating in the manner described in Manufacture Example 1, circuits and connection lands were formed on the surfaces. Similar to Manufacture Example 1, a liquid thermosetting solder resist was formed thinly over the configuration, after which nickel plating and gold plating were performed, to form a low thermal expansion printed circuit board C. The coefficient of thermal expansion of this printed circuit board C, in the areas for flip chip mounting and connecting, was −1.6 ppm/° C. in both the longitudinal and lateral directions.

Implementation Example 1

Using a silver paste (resistivity: 5.1×10⁻⁵ Ω-cm) having a $T_g$ (DMA measurement) of 232° C., the printed circuit boards A, which have a relatively higher coefficient of thermal expansion, were attached to both sides of the low thermal expansion printed circuit board B. This configuration was hardened in a 5 mmHg vacuum at 150° C. for 1 hour and at 180° C. for 1 hour. For this multi-layer printed circuit board, components held in the cavities processed into both sides were mounted on and connected to the low thermal expansion printed circuit board. Connection bumps were attached beforehand on the components. The bumps, which were made from lead-free solder (Sn-8.0Zn-3.0Bi, melting point: 190 to 197° C.), were attached during the reflow process at a maximum temperature of 220° C., to form a semiconductor plastic package.

This multi-layer printed circuit board mounted and connected with components was subject to a temperature cycle test from −45° C./30 min to 125° C./30 min for 1000 cycles. The test results are listed below in Table 1.

Implementation Example 2

Tests were performed in a manner substantially the same as Implementation Example 1, with the only difference being that the printed circuit board C was used for the low thermal expansion printed circuit board. The test results are listed below in Table 1.

Manufacture Example 4

Manufacture of a Second Board Having a High Coefficient of Thermal Expansion for Connecting to an Outside of a Printed Circuit Board having a Low Coefficient of Thermal Expansion 2,2-bis(4-cyanatophenyl)propane monomers of 550 parts by weight were dissolved at 160° C. and were reacted while being stirred for 4.5 hours, to yield a mixture of monomers and pre-polymers. The mixture was dissolved in methyl ethyl ketone and mixed with 100 parts by weight of a bisphenol A epoxy resin (product code: Epikote 1001, Japan Epoxy Resin Co., Ltd.), 150 parts by weight of a phenol novolac epoxy resin (product code: DEN-431, Dow Chemical Company), and 200 parts by weight of a cresol novolac epoxy resin (product code: ESCN-220 F, Sumitomo Chemical Co., Ltd.), after which 0.2 parts by weight of zinc octylate was added to the methyl ethyl ketone as a hardening catalyst. These were mixed and stirred well to provide a varnish D.

Also, 1000 parts by weight of a spherical silica (average particle diameter: 0.9 μm) inorganic filler, as well as 10 parts by weight of an epoxy silane coupling agent was added, stirred, and dispersed, to yield a varnish E.

The varnish E was impregnated into a 200 μm-thick aramid fiber woven fabric and dried, to fabricate a prepreg F having a gelation time of 111 seconds (at 170° C.) and a resin content of 55 weight %. Also, the varnish E was impregnated into a 40 μm-thick E-glass fiber woven fabric and dried, to fabricate a prepreg G having a gelation time of 113 seconds and a resin content of 67 weight %. Using one sheet of the prepreg F, 12 μm-thick layers of electro-deposited copper were arranged on both outer sides, and were stacked and molded in a 190° C., 20 kgf/cm², and 2 mmHg vacuum for 90 minutes, to fabricate a 0.2 mm-thick double-sided copper clad laminate H. After etching the copper to 1.2 µm on both sides of the double-sided copper clad laminate H, through-holes of a 150 µm diameter were formed using $CO_2$ laser. After a desmearing treatment, an electroless-plated copper layer of 0.9 µm thickness and an electroplated copper layer of 20 µm thickness were deposited on each side, and circuits were formed using a subtractive method to line/space widths of 40/40 µm. This was followed by a CZ treatment applied to the copper layers, after which one sheet of the prepreg G was arranged on each outer side, and a 12 µm-thick electro-deposited copper layer was arranged on an outside of the prepreg G. The configuration was stacked and molded in the same manner to fabricate a four-layer double-sided copper clad laminate. After etching the copper layers on the surfaces of this copper clad laminate to a thickness of 1.2 µm, blind via holes of a 50 µm diameter were formed by irradiating UV-YAG laser. After a desmearing treatment, the insides of the holes were filled with copper plating. Next, circuits were formed on the surfaces of this copper clad laminate, and the CZ treatment, stacking, and circuit-forming processes were repeated to fabricate a printed circuit board I. The connection lands were formed with a 425 µm pitch and 150 µm diameter. In the same manner as that of Manufacture Example 1, the lands were opened to a diameter of 100 µm, and development treatment was applied, after which nickel plating and gold plating were performed, to form a printed circuit board J having a relatively higher coefficient of thermal expansion. The coefficient of thermal expansion of this printed circuit board J was 11.3 ppm/° C. and 12.0 ppm/° C. in the longitudinal and lateral directions, respectively.

Manufacture Example 5

Manufacture of a Low Thermal Expansion First Board Using Aramid Fiber Woven Fabric Using two sheets of the prepreg F, which uses an aramid fiber woven fabric as a reinforcing material, 12 µm-thick layers of electro-deposited copper were arranged on both outer sides, and were stacked and molded in a 190° C., 20 kgf/cm², and 2 mmHg vacuum for 90 minutes, to fabricate a 0.4 mm-thick double-sided copper clad laminate K. After etching the copper to 1.2 µm on both sides of the double-sided copper clad laminate K, openings of a 150 µm diameter were formed using $CO_2$ laser, and a desmearing treatment was performed. Then, an electroless-plated copper layer of 1 µm thickness and an electroplated copper layer of 15 µm thickness were deposited on each side, and circuits and connection lands were formed on the surfaces. Similar to Manufacture Example 1 described above, a solder resist was formed, openings were formed, and a desmearing treatment was applied using plasma, after which nickel plating and gold plating were performed, to form a low thermal expansion printed circuit board L. The coefficient of thermal expansion of this printed circuit board L, in the areas for mounting and connecting the components, was 6.0 ppm/° C. and 5.8 ppm/° C. in the longitudinal and lateral directions, respectively.

Manufacture Example 6

Manufacture of a Low Thermal Expansion First Board Using T-Glass Fiber Woven Fabric Silica of 500 parts by weight was added to the varnish E, which was mixed and stirred well to yield a varnish M. The varnish M was impregnated into 100 µm-thick T-glass fibers or S-glass fibers and dried, to fabricate a prepreg N having a gelation time of 101 seconds (at 170° C.) and a resin content of 53 weight %. Using four sheets of the prepreg N, 12 µm-thick layers of electro-deposited copper were arranged on both sides, and the configuration was stacked and molded in a 190° C., 40 kgf/cm², 2 mmHg vacuum for 90 minutes, to fabricate a copper clad laminate having a thickness of 0.4 mm. The copper foils on the surfaces were etched to a thickness of 1.2 µm, through-holes were formed using a mechanical drill to a diameter of 150 µm, and a desmearing treatment was applied, after which copper plating was performed in substantially the same manner as that in Manufacture Example 1, and circuits and connection lands were formed on the surfaces. Also, similar to Manufacture Example 1 described above, a solder resist was formed, openings were formed, and a desmearing treatment was applied using plasma, after which nickel plating and gold plating were performed, to form a low thermal expansion printed circuit board O. The coefficient of thermal expansion of this printed circuit board O, in the areas for mounting and connecting the components, was 6.9 ppm/° C. and 7.3 ppm/° C. in the longitudinal and lateral directions, respectively.

Manufacture Example 7

Manufacture of a Low Thermal Expansion First Board Using Carbon Fiber Woven Fabric The varnish E was impregnated into 200 µm-thick carbon fiber woven fabric and dried, to fabricate a prepreg P having a gelation time of 102 seconds (at 170° C.) and a resin content of 55 weight %. Using two sheets of the prepreg P, 12 µm-thick layers of electro-deposited copper were arranged on both sides of the prepreg, and were stacked and molded in a 190° C., 20 kgf/cm², and 2 mmHg vacuum for 90 minutes, to fabricate a 0.4 mm-thick double-sided copper clad laminate. After etching the copper layers of the double-sided copper clad laminate to 5 µm, through-holes of a 200 µm diameter were formed using a diamond drill, and the resin composition used in Manufacture Example 1 was filled inside the holes and hardened. The excess resin was leveled by polishing, taking care not to stretch the reinforcing material, to result in the copper layers having a thickness of 1.5 to 2.3 µm. Afterwards, the centers of the resin were opened using $CO_2$ laser to form electrically conductive through-holes having a diameter of 100 µm, and a desmearing treatment was applied. Then, an electroless-plated copper layer of 0.9 µm thickness and an electroplated copper layer of 15 µm thickness were deposited, and circuits and connection lands were formed on the surfaces. Similar to Manufacture Example 1 described above, a solder resist was formed, openings were formed, and a desmearing treatment was applied, after which nickel plating and gold plating were performed, to form a low thermal expansion printed circuit board Q. The coefficient of thermal expansion of this printed circuit board Q, in the areas for mounting and connecting the components, was 4.8 ppm/° C. and 4.9 ppm/° C. in the longitudinal and lateral directions, respectively.

Implementation Example 3

Using a lead-free solder (Sn-3.5Ag, melting point: 221 to 223° C.) to attach a low thermal expansion printed circuit board manufactured according to Manufacture Example 5 with a printed circuit board having a relatively higher coefficient of thermal expansion manufactured according to Manufacture Example 4, the printed circuit boards having a relatively higher coefficient of thermal expansion were attached to both sides of the low thermal expansion printed circuit board, during the reflow process at a maximum temperature of 260° C. Components were mounted and connected using lead-free solder, as in Implementation Examples 1 and 2, and reliability tests were performed in substantially the same manner. However, the connecting of the components is not limited to the method described above, and various attaching methods may be used.

The test results are listed below in Table 1.

Implementation Example 4

Using a lead-free solder (Sn-3.5Ag, melting point: 221 to 223° C.) to attach a low thermal expansion printed circuit board manufactured according to Manufacture Example 6 with a printed circuit board having a relatively higher coefficient of thermal expansion manufactured according to Manufacture Example 4, the printed circuit boards having a relatively higher coefficient of thermal expansion were attached to both sides of the low thermal expansion printed circuit board, during the reflow process at a maximum temperature of 260° C. Components were mounted and connected using lead-free solder, as in Implementation Examples 1 and 2, and reliability tests were performed in substantially the same manner.

The test results are listed below in Table 1.

Implementation Example 5

Using a lead-free solder (Sn-3.5Ag, melting point: 221 to 223° C.) to attach a low thermal expansion printed circuit board manufactured according to Manufacture Example 7 with a printed circuit board having a relatively higher coefficient of thermal expansion manufactured according to Manufacture Example 4, the printed circuit boards having a relatively higher coefficient of thermal expansion were attached to both sides of the low thermal expansion printed circuit board, during the reflow process at a maximum temperature of 260° C. Components were mounted and connected using lead-free solder, as in Implementation Examples 1 and 2, and reliability tests were performed in substantially the same manner.

The test results are listed below in Table 1.

Implementation Example 6

For the high thermal expansion printed circuit board A manufactured according to Manufacture Example 1, the solder resist was opened for only one side in form a multi-layer printed circuit board, and reliability tests were performed in substantially the same manner, but with a component mounted and connected in only one side.

The test results are listed below in Table 1.

Implementation Example 7

For the high thermal expansion printed circuit board J manufactured according to Manufacture Example 4, the solder resist was opened for only one side in form a multi-layer printed circuit board, and reliability tests were performed in substantially the same manner, but with a component mounted and connected in only one side.

The test results are listed below in Table 1.

Comparative Example 1

Components were mounted and connected directly to both sides of a low thermal expansion multi-layer printed circuit board A such as that used in Implementation Examples 1 and 2, to form a board R. Test results for the board R are listed below in Table 2.

Comparative Example 2

Components were mounted and connected directly to both sides of a low thermal expansion multi-layer printed circuit board J such as that used in Implementation Examples 3 to 5, to form a board S. Test results for the board S are listed below in Table 2.

Comparative Example 3

A component was mounted and connected directly to one side of a low thermal expansion multi-layer printed circuit board A such as that used in Implementation Examples 1 and 2, to form a board T. Test results for the board T are listed below in Table 2.

Comparative Example 4

A component was mounted and connected directly to one side of a low thermal expansion multi-layer printed circuit board J such as that used in Implementation Examples 3 to 5, to form a board U. Test results for the board U are listed below in Table 2.

Comparative Example 5

For the double-sided copper clad laminate obtained by Manufacture Example 2, the copper foils on both sides were etched to a thickness of 1.2 μm. Afterwards, through-holes were formed using a mechanical drill to a diameter of 150 μm, and a desmearing treatment was applied using plasma. An electroless-plated copper layer of 1 μm thickness and an electroplated copper layer of 15 μm thickness were deposited on each side, circuits were formed on the surfaces, and a black copper oxide treatment was applied. Then, on either side of this copper clad laminate, one 40 μm-thick layer of the prepreg GEA-679FGR was arranged, and a 12 μm-thick layer of electro-deposited copper was arranged respectively on each outer side, all of which were stacked and molded as in Manufacture Example 1 to fabricate a four-layer double-sided copper clad laminate. The copper foils on the surface layers of this copper clad laminate were etched to a 1.2 μm thickness, blind via holes of 50 μm diameter were formed on both sides using UV-YAG laser, a desmearing treatment was applied, and the holes were filled with copper plating. Circuits were formed on the surfaces of this copper clad laminate, and a black oxide treatment was applied as described above. These procedures were repeated to obtain a fourteen-layer printed circuit board V Components were mounted directly on the surfaces on both sides, without implementing recesses in the portions where the components are mounted and connected. Test results for the board V are listed below in Table 2.

TABLE 1

|  | Implement. Example 1 | Implement. Example 2 | Implement. Example 3 | Implement. Example 4 | Implement. Example 5 | Implement. Example 6 | Implement. Example 7 |
|---|---|---|---|---|---|---|---|
| Component Mounting Connection Material Between Component(s) and Low Thermal Expansion PCB | Both Sides | Both Sides | Both Sides | Both Sides Lead-Free Solder | Both Sides | One Side | One Side |
| Connection Material Between Outer PCB's and Low Thermal Expansion PCB | Electrically Conductive Adhesive | Electrically Conductive Adhesive | Lead-free Solder | Lead-free Solder | Lead-free Solder | Electrically Conductive Adhesive | Lead-free Solder |
| Height of Component Protruding above PCB (μm) | 0 | 0 | 0 | 0 | 0 | 0 | 0 |
| Bending and Warpage (μm) | 67 | 55 | 80 | 73 | 91 | 93 | 101 |
| Number of Cracking or Detaching Defects (n/100) | 0 | 0 | 0 | 0 | 0 | 0 | 0 |
| Migration Resistance (Ω) in Low Thermal Expansion PCB (between Through-Holes) | | | | | | | |
| Normal | $7 \times 10^{13}$ | $6 \times 10^{13}$ | $7 \times 10^{13}$ | $5 \times 10^{13}$ | $5 \times 10^{13}$ | — | — |
| 200 hrs. | $4 \times 10^{12}$ | $5 \times 10^{12}$ | $8 \times 10^{10}$ | $8 \times 10^{11}$ | $5 \times 10^{10}$ | — | — |
| 700 hrs. | $6 \times 10^{11}$ | $3 \times 10^{11}$ | $9 \times 10^{9}$ | $1 \times 10^{10}$ | $7 \times 10^{9}$ | — | — |

TABLE 2

|  | Comparative Example 1 | Comparative Example 2 | Comparative Example 3 | Comparative Example 4 | Comparative Example 5 |
|---|---|---|---|---|---|
| Component Mounting Connection Material Between Component(s) and Low Thermal Expansion PCB | Both Sides | Both Sides | One Side Lead-Free Solder | One Side | Both Sides |
| Connection Material Between Outer PCB's and Low Thermal Expansion PCB | Low Thermal Expansion PCB not used | | | | Resin |
| Height of Component Protruding Above PCB (μm) | approx. 450 | approx. 450 | approx. 450 | approx. 450 | approx. 450 |
| Bending and Warpage (μm) | 122 | 110 | 554 | 318 | 109 |
| Number of Cracking or Detaching Defects (n/100) | 89 | 27 | 93 | 50 | 73 |
| Migration Resistance (Ω) in Low Thermal Expansion PCB (between Through-Holes) | | | | | |
| Normal | Low Thermal Expansion PCB not used | | | | — |

[Measurement Method]

(1) Height of Component Protruding Above Multi-Layer Printed Circuit Board

For a component mounted and connected to the printed circuit board using a connection material, the height of the portion of the component protruding above the surrounding multi-layer printed circuit board was measured on one side. Measuring the heights from both sides would lead to about twice as high a value. In manufacturing a thin printed circuit board, the height of the portion of component protruding outwards can act as an obstacle to reducing thickness.

(2) Bending and Warpage

For a hundred 40×100 mm module samples, each having two components of dimensions 10×10 mm and thickness 400 μm connected to the left, right, and middle on both sides of the printed circuit board, the bending and warpage were measured using a laser measurement apparatus. The initial printed circuit boards selected displayed bending and warpage of 50±10 μm. The maximum values of bending and warpage were measured using a laser measurement apparatus after mounting and connecting the components.

(3) Number of Cracking or Detaching Defects

For a hundred 40×100 mm module samples, each having two components of dimensions 10×10 mm and thickness 400 μm connected to the left, right, and middle on both sides of the printed circuit board, thermal impact temperature cycle tests were performed, in which the temperature was maintained at −45° C. for 30 minutes and then at 125° C. for 30 minutes. After 1000 cycles, the integrity of the connection was evaluated. Here, a change in resistance value of ±10% or more was classified as a defect. Also, the samples were also checked for cracking and detaching in the solder and electrically conductive adhesive.

(4) Migration Resistance

For each Example, the through holes were formed with 200 μm gaps in the low thermal expansion printed circuit board, and 100 samples were connected. The migration resistance was measured for a DC current of 30 V (85° C./85% RH).

As shown in the results of Table 1, Implementation Examples 1 to 5 have components mounted and connected on both sides of the boards, with the components connected to the low thermal expansion board using lead-free solder. It is noted that the circuit boards according to embodiments of the invention show less bending or warpage and virtually no cracking or detaching, in contrast to the Comparative Examples.

As set forth above, by utilizing a method of manufacturing a semiconductor package and a semiconductor plastic package manufactured using this method according to certain embodiments of the invention, damage to the semiconductor chips can be prevented, and manufacturing costs can be lowered. The connection material can also mitigate stresses, to prevent cracking in the boards and semiconductor chips, while preventing defects such as bending and warpage. As the coefficients of thermal expansion may be similar between the semiconductor chips and the multi-layered printed circuit board to which they are mounted, there may be less stresses in the connection material created by changes in temperature, etc., allowing higher connection reliability and fewer defects for the semiconductor chips. Furthermore, it is not necessary to use an underfill in the portions where the semiconductor chips are connected with the printed circuit board, which allows for easier reworking and lower costs.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A semiconductor plastic package comprising:
    a first board;
    a second board attached to either side of the first board, the second board electrically connected with the first board and having at least one cavity formed therein; and
    a component embedded in the cavity and connected with the first board by a flip chip method,
    the first board having a lower rate of thermal expansion than the second board, and
    the first board comprising:
        a core board having at least one through-hole selectively perforated therein, the through-hole being filled with a resin composition,
        a copper foil attached to either side of the core board and having an insulation layer attached thereto,
        a conduction through-hole selectively perforated in the resin composition, and
        a circuit formed on a surface of the core board.

2. The semiconductor plastic package of claim 1, wherein the cavity is formed such that the cavity disconnects the second board.

3. The semiconductor plastic package of claim 1, wherein the first board has a rate of thermal expansion within a range of −15 to 9 ppm/° C.

4. The semiconductor plastic package of claim 1, wherein the second boards each have a rate of thermal expansion within a range of 10 to 25 ppm/° C.

5. The semiconductor plastic package of claim 1, wherein the resin of the core board is any one selected from a group consisting of thermosetting resins, thermoplastic resins, UV-curable resins, and radical-curable resins.

6. The semiconductor plastic package of claim 1, wherein the core board is made from any material selected from a group consisting of inorganic fibers, organic fibers, and metals.

7. The semiconductor plastic package of claim 6, wherein the inorganic fibers include any one of glass fibers and ceramic fibers.

8. The semiconductor plastic package of claim 6, wherein the organic fibers include any one selected from a group consisting of poly oxibenzazole fibers, aromatic polyaramid fibers, liquid crystal polyester fibers, and carbon fibers.

9. The semiconductor plastic package of claim 6, wherein the organic fibers are formed as one of an aromatic polyaramid non-woven fabric reinforcement and an aromatic polyaramid woven fabric reinforcement.

10. The semiconductor plastic package of claim 6, wherein the metals include any one of Invar and copper-Invar.

11. The semiconductor plastic package of claim 1, further comprising:
    a board connection material interposed between the first board and the second board, the board connection material electrically connecting the first board with the second board.

12. The semiconductor plastic package of claim 11, wherein the board connection material is formed as one of bumps and electrically conductive adhesive.

13. The semiconductor plastic package of claim 12, wherein the electrically conductive adhesive includes any one silver paste and copper paste.

14. The semiconductor plastic package of claim 1, further comprising:
    a component connection material interposed between the component and the first board, the component connection material electrically connecting the component with the first board.

15. The semiconductor plastic package of claim 14, wherein the component connection material is formed as one of bumps and electrically conductive adhesive.

16. The semiconductor plastic package of claim 15, wherein the electrically conductive adhesive includes any one silver paste and copper paste.

17. The semiconductor plastic package of claim 1, wherein the component has a thickness smaller than or equal to a thickness of the second board.

18. A semiconductor plastic package comprising:
    a first board;
    a second board attached to either side of the first board, the second board electrically connected with the first board and having at least one cavity formed therein;
    a component embedded in the cavity and connected with the first board by a flip chip method; and
    a board connection material interposed between the first board and the second board, the board connection material electrically connecting the first board with the second board,
    the first board having a lower rate of thermal expansion than the second board, and the board connection material being formed as one of bumps and electrically conductive adhesive.

19. A semiconductor plastic package comprising:
    a first board;
    a second board attached to either side of the first board, the second board electrically connected with the first board and having at least one cavity formed therein;
    a component embedded in the cavity and connected with the first board by a flip chip method; and
    a component connection material interposed between the component and the first board, the component connection material electrically connecting the component with the first board,
    the first board having a lower rate of thermal expansion than the second board, and the component connection material being formed as one of bumps and electrically conductive adhesive.

* * * * *